(12) United States Patent
Okada

(10) Patent No.: US 7,566,249 B2
(45) Date of Patent: Jul. 28, 2009

(54) ELECTRIC JUNCTION BOX

(75) Inventor: Akinori Okada, Yokkaichi (JP)

(73) Assignee: Sumitomo Wiring Systems, Ltd., Yokkaichi (JP)

( * ) Notice: Subject to any disclaimer, the term of this patent is extended or adjusted under 35 U.S.C. 154(b) by 630 days.

(21) Appl. No.: 11/289,713

(22) Filed: Nov. 30, 2005

(65) Prior Publication Data

US 2006/0131045 A1    Jun. 22, 2006

(30) Foreign Application Priority Data

Dec. 17, 2004    (JP)    ............... 2004-366696

(51) Int. Cl.
  *H01R 9/22*    (2006.01)
(52) U.S. Cl. .................... 439/709; 439/718
(58) Field of Classification Search .......... 439/709, 439/712, 718
  See application file for complete search history.

(56) References Cited

U.S. PATENT DOCUMENTS 6,710,247 B2    3/2004    Nojima
6,753,472 B2    6/2004    Ito

FOREIGN PATENT DOCUMENTS

JP    2004-127704    4/2004

OTHER PUBLICATIONS

English Language Abstract of JP 2004-127704, (Apr. 22, 2004).

*Primary Examiner*—Khiem Nguyen
(74) *Attorney, Agent, or Firm*—Greenblum & Bernstein, PLC

(57) ABSTRACT

An electric junction box having an aperture on one side of a case that houses conductive material, the aperture receiving a subsequently installed component when the electric junction box is assembled. The conductive material mounted in the case is exposed at the aperture; wires connecting to other conductive material are passed through the aperture; and a cover provided inside the aperture is folded to cover the conductive material while the wires are installed, preventing interference of the wires with the subsequently installed part.

17 Claims, 5 Drawing Sheets

PRIOR ART

ELECTRIC JUNCTION BOX

CROSS-REFERENCE TO RELATED APPLICATIONS

The present disclosure relates to subject matter contained in priority Japanese Application No. 2004-366696, filed on Dec. 17, 2004, which is herein expressly incorporated by reference in its entirety.

BACKGROUND OF THE INVENTION

1. Field of the Invention

The present invention relates to an electric junction box, and more particularly to an electric junction box having an aperture to which a component is subsequently fitted and installed in assembly, the electric junction box preventing the subsequently installed component from contacting conductive material including internal circuits and wires, which are mounted in the electric junction box.

2. Description of Related Art

A conventional electric junction box mounted in an automobile, as disclosed in Japanese Patent Laid-open Publication 2004-127704, has the construction as shown in FIG. 6. In the FIG. 6 device of the prior art, bolt-fastening terminals 3 provided at ends of wires w are bolt-fastened to bus bars 2 exposed on an exterior surface of case 1 of the electric junction box. The bolt-fastened portions are covered with separate cover 4 so as to prevent wire harnesses (not shown in the figure) routed adjacent to the electric junction box from contacting bus bars 2.

The prior art electric junction box described above is provided with the cover on the external surface of the case of the electric junction box, so that the wire harnesses routed near the electric junction box do not interfere with the bus bars exposed outside the assembled electric junction box. However, when a component is later fitted and installed in a large opening formed on the electric junction box to complete assembly of the electric junction box in an automobile assembly process, there are additional problems that the cover disclosed in JP No. 2004-127704 is unable to solve. That is, the later installed component must be prevented from contacting wires, which are directly connected to fuse terminals or relay terminals mounted on the upper side of the electric junction box and pulled out from inside the case to the outside, and conductive material, including the bus bars exposed at the opening that receive the later installed component. Further, a contact prevention member should occupy only a minimal space inside the case so as not to enlarge the case.

SUMMARY OF THE INVENTION

The present invention is provided to address the above described problems. An object of the present invention is to provide an electric junction box, which is subsequently fitted and installed with a component when assembled, that prevents conductive material and wires mounted in a case from interfering with the subsequently installed component as well as minimizes a space that an interference protection member occupies inside the case.

An aspect of the present invention provides an electric junction box having a case that houses conductive material and an aperture to receive a subsequently installed component on one side of the case, the electric junction box including first conductive material housed inside the case and exposed at the aperture; wires connected to second conductive material, the wires: passing through the aperture; and a cover provided in the aperture, the cover being configured to cover the first conductive material while the wires are passed through the aperture in a lateral direction, and the cover being configured to prevent interference between the wires and the subsequently installed component. Further, the cover is folded to cover the first conductive material while the wires are passed through the aperture in a lateral direction and to prevent interference between the wires and the subsequently installed component. Additionally, the cover may be formed separately from the case; and the cover may be locked to the case.

In a further aspect of the present invention, the cover includes a base configured to cover directly the first conductive material; a hinge portion provided at an edge of the base; and a lid that folds about the hinge portion toward and away from the base; wherein the wires pass between the base and the lid and extend through a gap between the base and the lid. Further, the cover may be configured so that the subsequently installed component fits into the aperture on the opposite side of the cover from the first conductive material. Further, the base extends to joints of the first conductive material and bolt fastening terminals provided at ends of power cables, and covers the bolt fastening terminals. The cover may include latching tabs configured to lock the cover to the case. The electric junction box may include a plurality of ribs extending from a rear surface of the base, the plurality of ribs configured to cooperate with a rib provided on the case for assembling the electric junction box; and the lid may include latching tabs configured to lock the lid to the base.

A further aspect of the present invention provides a method of assembling an electric junction box having a case that houses conductive material and an aperture to receive a subsequently installed component on one side of the case, the method including providing a first conductive material housed inside the case and exposed at the aperture; providing wires connected to second conductive material, the wires passing through the aperture; and providing a cover in the aperture, the cover being configured to cover the first conductive material while the wires are passed through the aperture in a lateral direction, and the cover being configured to prevent interference between the wires and the subsequently installed component. Further, the method may include folding the cover to cover the first conductive material while the wires are passed through the aperture in a lateral direction and to prevent interference between the wires and the subsequently installed component. Additionally, the method may include attaching the base to the case; aligning the wires adjacent the base; folding the lid about the hinge such that the wires are positioned between the base and the lid and extend through a gap between the base and the lid; and locking the cover to the case includes connecting the latching tabs to the case. Further, the method may include sliding the cover into the aperture such that the plurality of ribs interconnect with the rib provided on the case; and locking the lid to the base.

In the present invention, therefore, the cover is provided inside the case at the inner end of the aperture for receiving the subsequently installed component, and the subsequently installed component is fitted into the aperture sandwiching the cover when the electric junction box is assembled. Examples of the subsequently installed component include a power distribution unit, which has a bus bar affixed to the rear surface of a printed circuit board and a heat sink integrally mounted on the bus bar affixed side, a relay block, and a fusible link.

According to the above-described structure, the cover covers the conductive material, including the bus bars premounted in the case and exposed at the aperture, thereby preventing a short circuit that may occur as the conductive material makes direct contact with the wires connected to second conductive material. Further, the wires are pulled out while shielded by the cover, thus preventing damage to or breaking of the wires due to interference with the subsequently installed component when the subsequently installed component is fitted into the aperture provided on the case.

The cover formed as a separate part has a base that directly covers the conductive material and a lid that folds toward the base at a thin hinge portion provided at a lower end of the base. The wires are passed between the base and the lid, bent in the lateral direction and pulled out from a side gap between the base and the lid. In the present invention, the wires, passing through the gap between the base and the lid of the cover, do not spread inside the aperture. The wires thereby do not hamper operations for fitting the subsequently installed component, thus facilitating the fitting operations.

The subsequently installed component is fitted into the aperture on the opposite side of the conductive material having the cover therebetween. That is, while the cover base is placed between the conductive material and the wires, the cover lid is placed between the wires and the subsequently installed component. Thus, the cover separates the conductive material, the wires and the subsequently installed component from one another, preventing interference among the parts. Further, the cover requires no large space in the case since the base is simply placed between the conductive material and the wires, and the lid between the wires and the subsequently installed component.

According to the present invention as described above, the cover covers the conductive material exposed at the opening on the case of the electric junction box, thus preventing a short circuit due to a direct contact between the conductive material and the wires connected to the other conductive material. Further, passing the wires inside the cover prevents damage to and breaking of the wires due to interference of the wires and the subsequently installed component when the subsequently installed component is fitted into the aperture in the case. Furthermore, keeping the wires from spreading inside the aperture does not hamper operations for fitting the subsequently installed components, thus the assembly operations are performed easily.

When the cover is formed of the base and the lid, the wires are passed between the base and the lid of the cover and pulled out while protected from both the conductive material and the subsequently installed component in the case, thereby further ensuring protection of the wires.

BRIEF DESCRIPTION OF THE DRAWINGS

The above, and other objects, features and advantages of the present invention will be made apparent from the following description of the preferred embodiments, given as non-limiting examples, with reference to the accompanying drawings in which.

DETAILED DESCRIPTION OF THE INVENTION

The particulars shown herein are by way of example and for purposes of illustrative discussion of the embodiments of the present invention only and are presented in the cause of providing what is believed to be the most useful and readily understood description of the principles and conceptual aspects of the present invention. In this regard, no attempt is made to show structural details of the present invention in more detail than is necessary for the fundamental understanding of the present invention, the description is taken with the drawings making apparent to those skilled in the art how the forms of the present invention may be embodied in practice.

The embodiments of the present invention are described with reference to the drawings. FIGS. 1 to 4 show a first embodiment of the present invention. Case 11 of electric junction box 10 is provided on one side with aperture or cut-out opening 12 to which a subsequently installed component may be fitted. Fitting subsequently installed component 60 into aperture 12 completes assembly of electric junction box 10.

Figure 2:
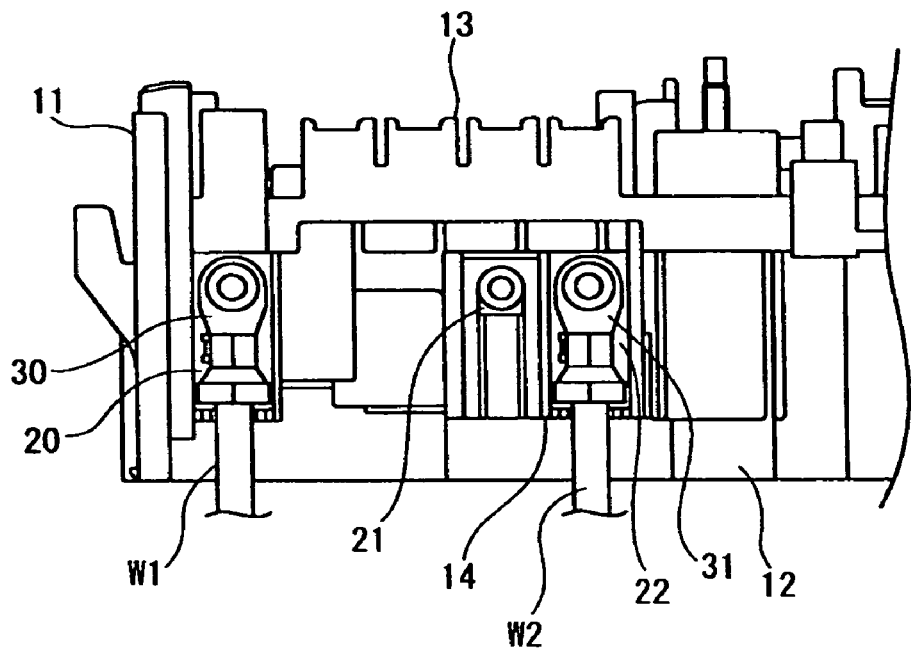
FIG. 2 is a partial front view of the electric junction box of FIG. 1A, showing bolt fastening terminals bolt-fastened to bus bars.
Figure 3:
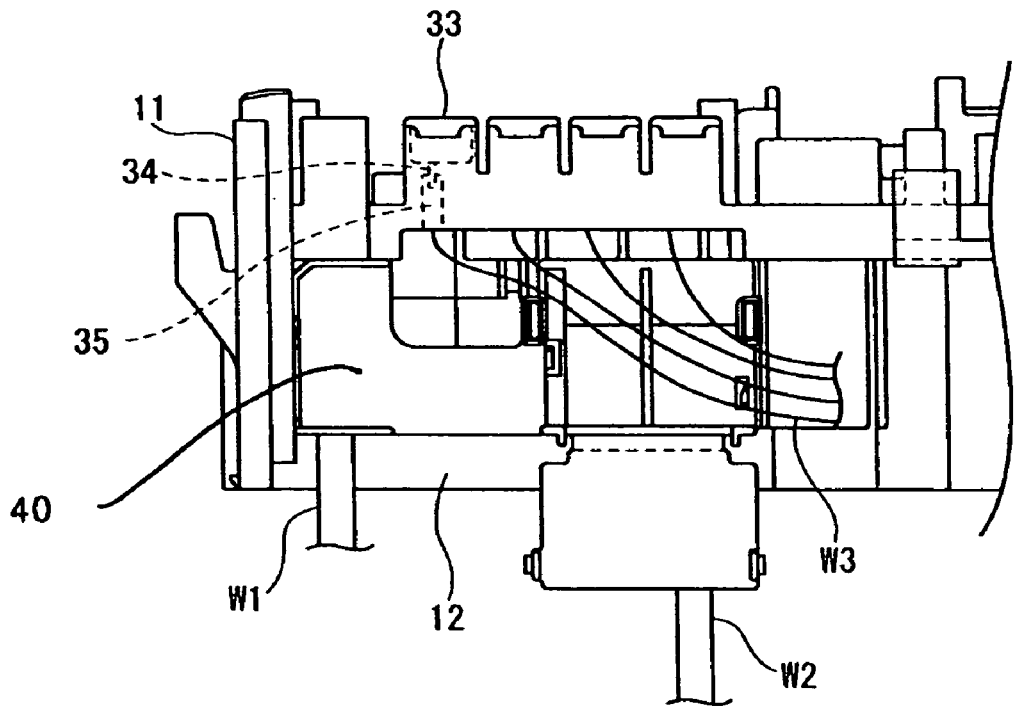
FIG. 3 is a partial front view of the electric junction box of FIG. 1A, showing a case with a cover attached.

As shown in FIG. 2, bus bars 20, 21, 22 are exposed at aperture 12 of case 11. Bus bars 20, 21, 22 may be made of any suitable electrically conductive material. Bolt fastening terminals 30, 31 are provided at ends of the power cables w1 and w2, which are connected to a suitable component such as, for example, a battery or an alternator. The bolt fastening terminals 30, 31 are fastened by bolts to bus bars 20, 21, respectively. As shown in FIG. 2, rib 14 projects from the case 11 and extends vertically between bus bars 21 and 22. The rib 14 provides insulation between bus bars 21 and 22. On the upper surface of case 11, a plurality of fuse housings 13 are positioned adjacent each other along the edge of aperture 12. The electric junction box of the present invention may include any suitable number of fuse housings 13, and in the present embodiment includes four fuse housings. As shown in FIG. 3, terminal holders (not shown in the figure) provided on the lower side of fuse housings 13 hold terminals 35 provided at first ends of wires w3 and connect terminals 35 to terminals 34 of fuses 33 housed in fuse housings 13, thus connecting wires w3 with internal circuits inside the case via fuses 33. Fuses 33 may be formed of any suitable electrically conductive material. The second ends of wires w3 are connected to respective electric components.

Figure 4A:
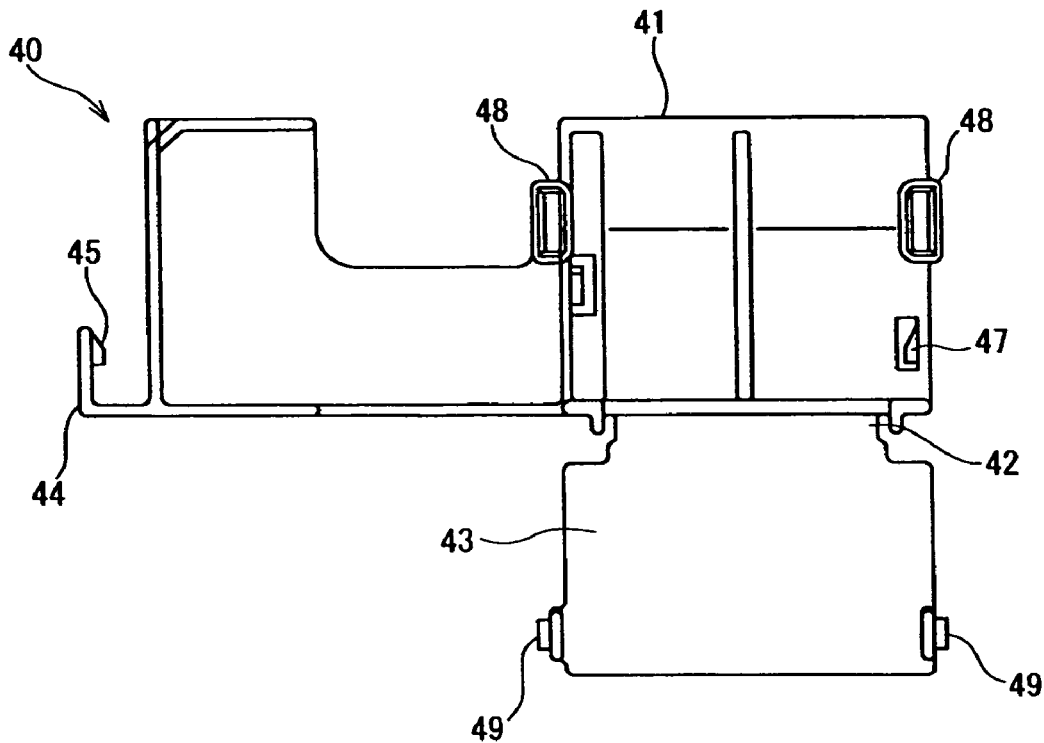
FIG. 4A is a front view of the cover of the electric junction box of FIG. 1A.
Figure 4B:
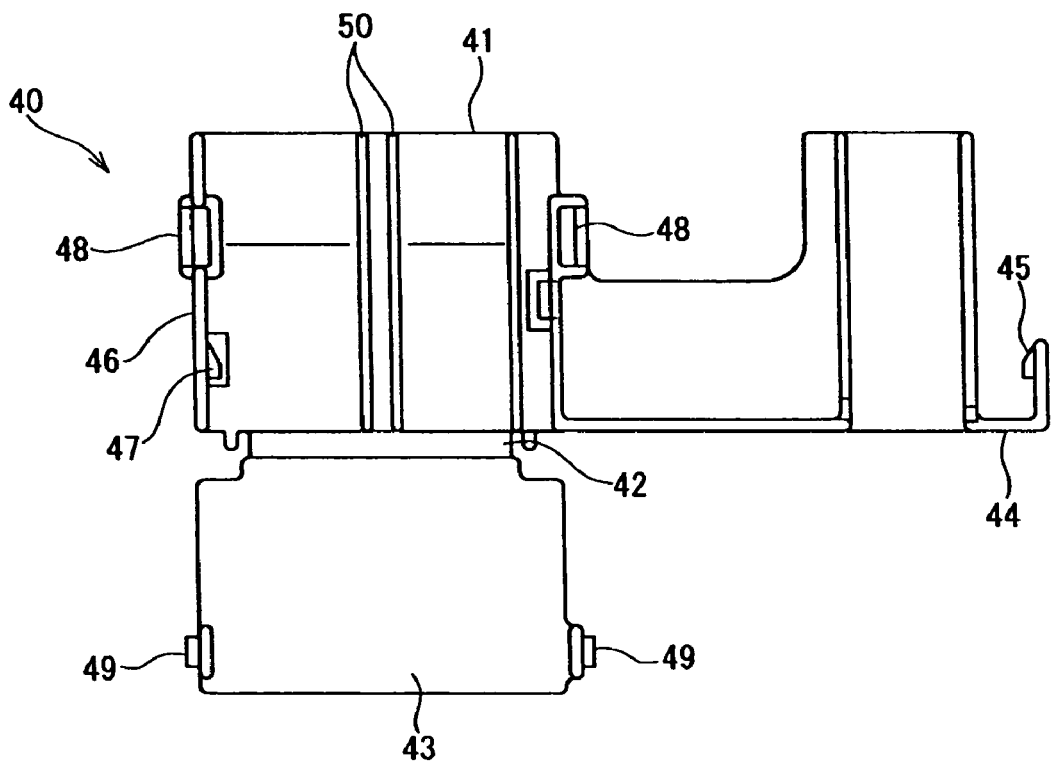
FIG. 4B is a rear view of the cover of the electric junction box of FIG. 1A.

Cover 40 may be attached to aperture 12 to provide insulation between bus bars 20, 21, 22 and wires w3. The cover 40 includes base 41 that directly covers bus bars 20, 21, 22. The cover also includes lid 43, and thin hinge portion 42 provided at the lower end of the base 41. The lid 43 folds toward the base 41 about thin hinge portion 42. L-shaped latching hook 44, projecting from one side of base 41 (the right side as shown in FIG. 4B), has latching tab 45 at the end of the inner surface. Rib 46, projecting from the rear surface of the other side of base 41 (the left side as shown in FIG. 4 (B)), has latching tab 47 on the inner side. Latching tabs 45 and 47 are tapered toward the upper side. Locking frames 48 are provided at predetermined positions on base 41; and latching tabs 49 are provided on lid 43. Thus, when lid 43 is folded toward base 41 pivoting on thin hinge portion 42, latching tabs 49 on lid 43 lock into locking frames 48 on base 41, allowing lid 43 to stay folded on base 41. Predetermined gaps between base 41 and lid 43 are formed leaving upper and side portions open, so that wires w3 pass through the gaps. Two vertically extending guiding ribs 50 are provided projecting from the rear surface of base 41.

Figure 1A:
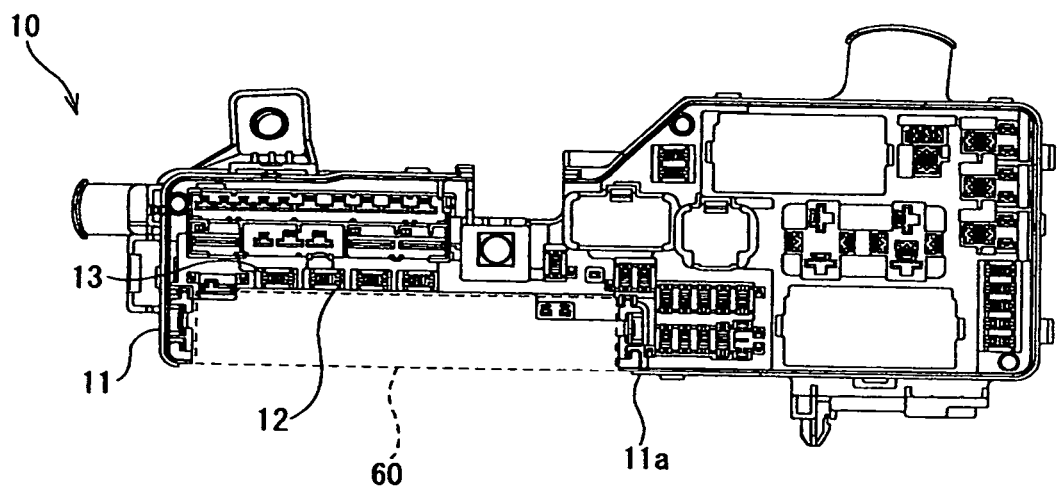
FIG. 1A is a top plan view of an electric junction box, with an upper cover and a lower cover removed, according to a first embodiment of the present invention.
Figure 1B:
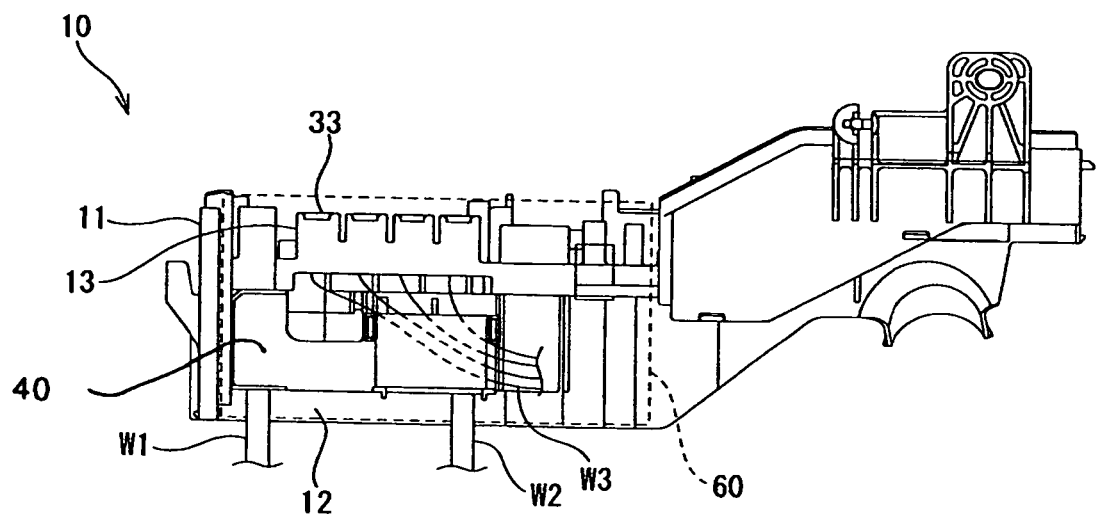
FIG. 1B is a front view of the electric junction box, with an upper cover and a lower cover removed, of FIG. 1A.

As shown in FIG. 3, cover 40 is inserted into case 11 from below (i.e., the cover is moved in an upward direction as shown in FIG. 3) so that base 41 of cover 40 covers bus bars 20, 21, 22, which are exposed at aperture 12 of case 11. Cover 40 also covers bolt-fastening terminals 30, 31 at the ends of power cables w1, w2, which are bolt-fastened to bus bars 20 and 21. As shown in FIG. 1B, wires w3 extend in from the upper opening through the gap between base 41 and lid 43 of cover 40, bend in a lateral direction, and then extend out from the side opening (the side gap).

A method of assembling the electric junction box according to the first embodiment is described below. First, as shown in FIG. 2, bolt-fastening terminals 30, 31 at the ends of power cables w1 and w2 are bolt-fastened to bus bars 20 and 22 exposed at aperture 12 on case 11 of electric junction box 10. Base 41 of cover 40 will be pushed upward from below along bus bars 20, 21, 22. Latching tabs 45 and 47 on cover 40 are locked into locking portions (not shown in the figure) of case 11 so as to lock cover 40 to case 11 and to cover bus bars 20, 21, 22 and bolt-fastening terminals 30, 31 with the rear side of base 41 of cover 40. When the cover 40 is attached as described above, rib 14 provided between bus bars 21 and 22 is inserted between two guiding ribs 50 provided on the rear side of base 41 of cover 40, and cover 40 is slid along two guiding ribs 50. Since cover 40 is attached while being positioned, the attaching operations are easily performed.

Then, terminals 35 at the ends of wires w3 are housed in the terminal holders on the rear side of fuse housings 13 provided on case 11. While wires w3 are aligned on the front side of base 41 of base 40 as shown in FIG. 3, lid 43 is folded toward base 41 pivoting on thin hinge portion 42, then locked into cover 40. Finally, subsequently installed component 60 is fitted into aperture 12 provided on case 11; fuses 33 are housed in fuse housings 13; fuse terminals 34 and terminals 35 at the ends of wires w3 are connected; and the upper cover and the lower cover (both are not shown in the figure) are attached to the upper and lower surfaces of case 11, respectively.

In the construction above, base 41 of cover 40 attached to case 11 of electric junction box 10 covers bus bars 20, 21, 22 exposed at aperture 12 of case 11. The construction thus prevents a short circuit due to a direct contact between bus bars 20, 21, 22 (first conductor) and wires w3 connected to terminals 34 of fuses 33 (second conductor). Further, passing wires w3 between base 41 and lid 43 of cover 40 prevents damage to or breaking of wires w3 due to interference of wires w3 and subsequently installed component 60, when subsequently installed component 60 is fitted into aperture 12 provided on case 11. Further, passing wires w3 between base 41 and lid 43 of cover 40 prevents spreading of wires w3 inside opening 12, thereby facilitating fitting of subsequently installed component 60 as wires w3 do not hamper the fitting operations.

Figure 5:
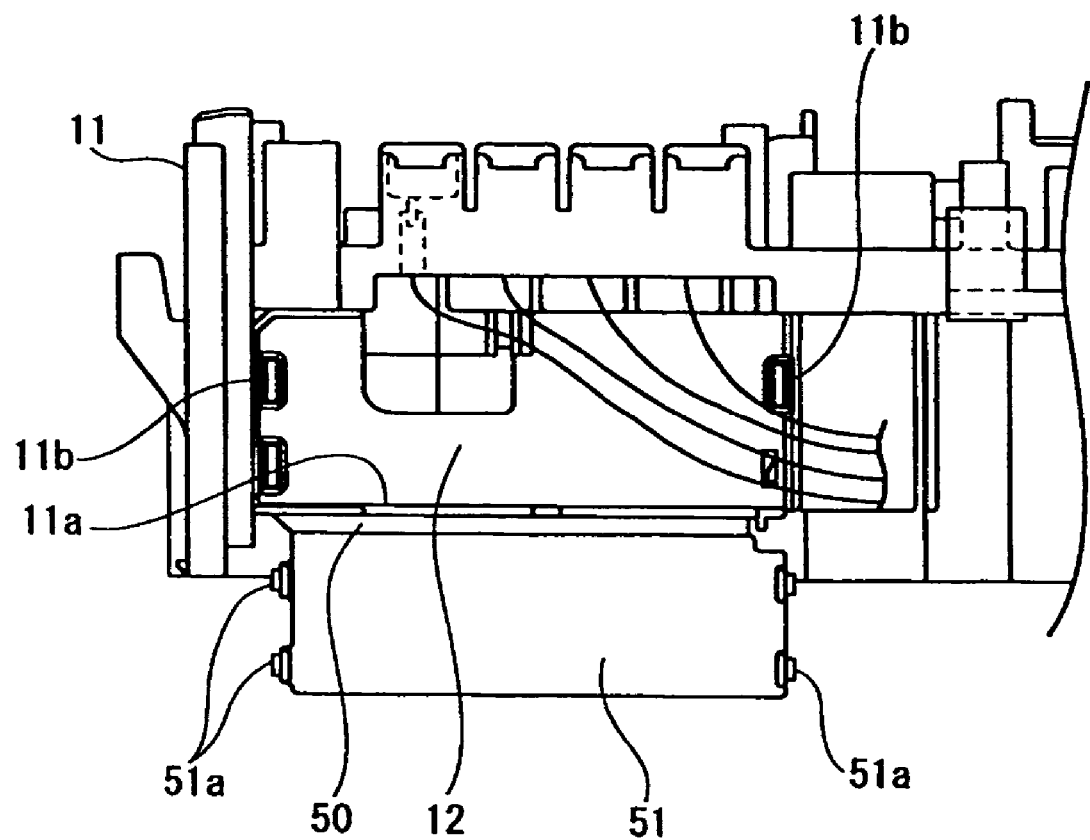
FIG. 5 is a partial front view of an electric junction box with a cover attached according to a second embodiment of the present invention.
Figure 6:
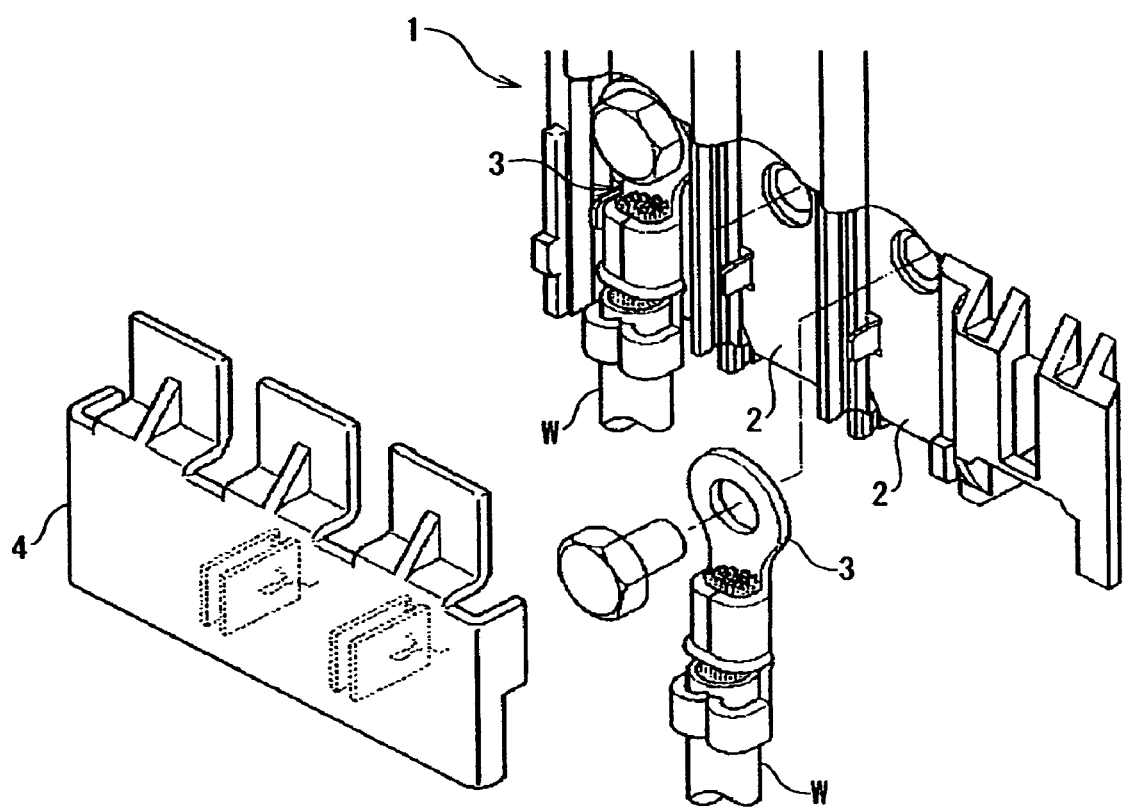
FIG. 6 is a perspective view of an electrical junction box of the prior art.

FIG. 5 shows a second embodiment of the present invention, wherein cover 51 extends from lower frame 11a at aperture 12 on case 11 via thin hinge portion 50. Cover 51 may be formed in any suitable manner, and in the present embodiment is formed integrally and in one piece with the case 11. Wires that connect to fuses are passed through the aperture 12. After wires that connect to fuses mounted on the electric junction box are passed through the aperture in the case, cover 51 is folded upward pivoting on thin hinge portion 50, so that cover 51 covers the wires and conductive material inside the case. Then, locking portions 11b provided on case 11 and locking portions 51a provided on cover 51 are locked. The wires extend out from both the top and left side of cover 51. Similar to the first embodiment, the subsequently installed component is then fitted into opening 12 and attached to the case.

Although the invention has been described with reference to an exemplary embodiment, it is understood that the words that have been used are words of description and illustration, rather than words of limitation. Changes may be made within the purview of the appended claims, as presently stated and as amended, without departing from the scope and spirit of the invention in its aspects. Although the invention has been described with reference to particular means, materials and embodiments, the invention is not intended to be limited to the particulars disclosed. Rather, the invention extends to all functionally equivalent structures, methods, and uses such as are within the scope of the appended claims.

What is claimed is:

1. An electric junction box having a case that houses conductive material and an aperture to receive a subsequently installed component on one side of the case, said electric junction box comprising:
   first conductive material housed inside the case and exposed at said aperture;
   wires connected to second conductive material, said wires passing through said aperture; and
   a cover provided in said aperture, said cover being configured to cover said first conductive material while the wires are passed through the aperture in a lateral direction, and said cover being configured to prevent interference between the wires and the subsequently installed component;
   said cover comprising:
      a base configured to cover directly said first conductive material;
      a hinge portion provided at an edge of said base; and
      a lid that folds about said hinge portion toward and away from said base;
   wherein said wires pass between said base and said lid and extend through a gap between said base and said lid.

2. The electric junction box according to claim 1, wherein:
   said cover is folded to cover said first conductive material while the wires are passed through the aperture in a lateral direction and to prevent interference between the wires and the subsequently installed component.

3. The electric junction box according to claim 1, wherein:
   said cover is formed separately from said case.

4. The electric junction box according to claim 3, wherein:
   said cover is locked to said case.

5. The electric junction box according to claim 1, wherein said cover is configured so that the subsequently installed component fits into said aperture on the opposite side of the cover from said first conductive material.

6. The electric junction box according to claim 1, wherein said base extends to joints of said first conductive material and bolt fastening terminals provided at ends of power cables, and covers the bolt fastening terminals.

7. The electric junction box according to claim 4, wherein:
   said cover includes latching tabs configured to lock said cover to said case.

8. The electric junction box according to claim 1, further comprising:

a plurality of ribs extending from a rear surface of said base, said plurality of ribs configured to cooperate with a rib provided on said case for assembling said electric junction box.

9. The electric junction box according to claim 1, wherein:
said lid includes latching tabs configured to lock said lid to said base.

10. A method of assembling an electric junction box having a case that houses conductive material and an aperture to receive a subsequently installed component on one side of the case, said method comprising:
providing a first conductive material housed inside the case and exposed at said aperture;
providing wires connected to second conductive material, said wires passing through said aperture; and
providing a cover in said aperture, said cover being configured to cover said first conductive material while the wires are passed through the aperture in a lateral direction, and said cover being configured to prevent interference between the wires and the subsequently installed component;
said cover further comprising:
a base configured to cover directly said first conductive material;
a hinge portion provided at an edge of said base; and
a lid that folds about said hinge portion toward and away from said base;
said method further comprising:
attaching said base to said case;
aligning said wires adjacent said base; and
folding said lid about said hinge such that said wires are positioned between said base and said lid and extend through a gap between said base and said lid.

11. The method of assembling an electric junction box according to claim 10, further comprising:
folding said cover to cover said first conductive material while the wires are passed through the aperture in a lateral direction and to prevent interference between the wires and the subsequently installed component.

12. The method of assembling an electric junction box according to claim 10, further comprising:
providing said cover separately from said case.

13. The method of assembling an electric junction box according to claim 12, further comprising:
locking said cover to said case.

14. The method of assembling an electric junction box according to claim 10, further comprising fitting said subsequently installed component into said aperture on the opposite side of the cover from said first conductive material.

15. The method of assembling an electric junction box according to claim 13, wherein said cover includes latching tabs configured to lock said cover to said case, said method further comprising:
connecting said latching tabs to said case to lock said cover to said case.

16. The method of assembling an electric junction box according to claim 10, wherein said base includes a plurality of ribs extending from a rear surface thereof to cooperate with a rib provided on said case, said method further comprising:
sliding said cover into said aperture such that said plurality of ribs interconnect with said rib provided on said case.

17. The method of assembling an electric junction box according to claim 10, wherein said lid includes latching tabs configured to lock said lid to said base, said method further comprising:
connecting said latching tabs to said base to lock said lid to said base.

* * * * *